US012613280B2

(12) United States Patent
Martinez et al.

(10) Patent No.: US 12,613,280 B2
(45) Date of Patent: Apr. 28, 2026

(54) SYSTEM AND METHOD OF ESTIMATING STATE OF CHARGE OF BATTERY USING COULOMB COUNTING ESTIMATION WITH PERIODIC CALIBRATION USING ARTIFICIAL INTELLIGENCE BASED ESTIMATION

(71) Applicant: NXP B.V., Eindhoven (NL)

(72) Inventors: Vincent Pierre Martinez, Venerque (FR); Alexandre Giraud, Carquefou (FR); Philippe Jean-Pierre Perruchoud, Tournefeuille (FR)

(73) Assignee: NXP B.V., Eindhoven (NL)

( * ) Notice: Subject to any disclaimer, the term of this patent is extended or adjusted under 35 U.S.C. 154(b) by 803 days.

(21) Appl. No.: 18/046,517

(22) Filed: Oct. 14, 2022

(65) Prior Publication Data
US 2023/0123869 A1 Apr. 20, 2023

(30) Foreign Application Priority Data
Oct. 18, 2021 (EP) ..................................... 21306454

(51) Int. Cl.
  *G01R 31/3832* (2019.01)
  *G01R 31/367* (2019.01)
(52) U.S. Cl.
  CPC ....... *G01R 31/3833* (2019.01); *G01R 31/367* (2019.01)
(58) Field of Classification Search
  CPC .............. G01R 31/3833; G01R 31/367; G01R 35/005; G01R 31/396; G01R 31/3648; H01M 2010/4271
  See application file for complete search history.

(56) References Cited

U.S. PATENT DOCUMENTS 10,310,021 B2 6/2019 Tagade et al.
2018/0252775 A1* 9/2018 Wu ........................ H01M 10/48
(Continued)

FOREIGN PATENT DOCUMENTS

CN 105974327 A 9/2016
CN 110133510 A 8/2019

OTHER PUBLICATIONS

Chemali Ephrem et al.: "Long Short-Term Memory Networks for Accurate State-of-Charge estimation of li-ion Batteries", 10 pages, IEEE Transaction of industrial electronics, vol. 65, No. 8, Apr. 2, 2018, pp. 6730-6739.
(Continued)

*Primary Examiner* — Ricky Go

(57) ABSTRACT
A battery management system for tracking a state of charge of a battery including multiple cells including a coulomb counter (CC) estimator and an artificial intelligence (AI) estimator. The CC estimator determines a charge difference over time for tracking changes of a state of charge of each cell and updates a corresponding state of charge value. The AI estimator converts a set of sample values of a cell into an estimated state of charge for calibrating the cell. A controller may periodically invoke the AI estimator to calibrate the state of charge of each cell and to update a corresponding state of charge value. Processing by the AI estimator may be minimized by being used only to calibrate each cell before combined error of the CC estimator reaches a predetermined threshold. AI based calibration may use Long Short-Term Memories and may further incorporate voltage mean and voltage variance over time.

19 Claims, 7 Drawing Sheets

(56) References Cited

U.S. PATENT DOCUMENTS

| | | | |
|---|---|---|---|
| 2020/0081070 A1 | 3/2020 | Chemali et al. | |
| 2020/0287414 A1* | 9/2020 | Kusunoki | H02J 7/0013 |
| 2021/0288357 A1* | 9/2021 | Kuriki | H02J 7/0048 |
| 2023/0016228 A1* | 1/2023 | Simonis | G01R 31/367 |

OTHER PUBLICATIONS

Chen, Zhihang et al. "Battery State of Charge Estimation Based on a Combined Model of Extended Kalman Filter and Neural Networks." Proceedings of International Joint Conference on Neural Networks, San Jose, CA., Jul. 31-Aug. 5, 2011. pp. 2156-2163.

Codeca, Fabio et al; "On battery State of Charge estimation: A new mixed algorithm"; IEEE Int'l Conf. on Control Applications, San Antonio TX, USA, Sep. 3-5, 2008; 6 pages (2008).

Hossain Lipu M.S. et al.: "Data-driven state of charge estimation of lithium-ion batteries: Algorithms, implementation factors, limitations and future trends.", Journal of Cleaner Production, vol. 277, Sep. 7, 2020, 29 pages.

Nugraha, Derry Rifqi Septian et al. "State of Charge Estimation of Lead-Acid Battery with Coulomb Counting and Feed-Forward Neural Network Method." 2020 FORTEI-International Conference on Electrical Engineering (FORTEI-ICEE). pp. 119-124.

Nugroho, Asep et al; "Battery State of Charge Estimation by Using a Combination of Coulomb Counting and Dynamic Model With Adjusted Gain"; IEEE Int'l Conf. on Sustainable Energy Engineering and Application, Bandung, Indonesia, Oct. 5-7, 2015; 5 pages (2015).

Tian Jimpeng et al State-of-charge estimation of LiFePO4 batteries in electric vehicles: A deep-learning enabled approach. 10 pages. Applied Energy, vol. 291, Mar. 23, 2021.

Vidal Carlos et al: "Machine Learning Applied to Electrified Vehicle Battery State of Charge and State of Health Estimation: Start-of-the-Art", 19 Pages, IEEE Access, IEEE, USA, vol. 8, Mar. 13, 2020, pp. 52796-52814.

Vidal, Carlos et al; "Li-ion Battery State of Charge Estimation Using Long Short-Term Memory Recurrent Neural Network with Transfer Learning"; IEEE Transportation Electrification Conference and Expo, Detroit, MI, USA, Jun. 19-21, 2019; 6 pages (2019).

* cited by examiner

SYSTEM AND METHOD OF ESTIMATING STATE OF CHARGE OF BATTERY USING COULOMB COUNTING ESTIMATION WITH PERIODIC CALIBRATION USING ARTIFICIAL INTELLIGENCE BASED ESTIMATION

CROSS-REFERENCE TO RELATED APPLICATIONS

This application claims the priority under 35 U.S.C. § 119 of European patent application no. 21306454.6, filed 18 Oct. 2021, the contents of which are incorporated by reference herein.

BACKGROUND

Field of the Invention

The present invention relates in general to battery management systems, and more particularly to a system and method of estimating the state of charge of a battery based on coulomb counting with periodic calibration using artificial intelligence based estimation.

Description of the Related Art

Rechargeable batteries are used in a variety of electronic devices and electrical systems. The present disclosure is applicable to any type of technology that employs rechargeable batteries including vehicles in the automotive industry, such as electric vehicle (EVs), hybrid EV (HEVs), plug-in HEV (PHEVs), etc. Battery Management System (BMS) is an essential component of such electric vehicles which ensures energy efficiency and safety by means of constant monitoring of the current, voltage and temperature of the battery cells of a rechargeable battery. BMS may be used to avoid dangerous events such as over-voltage, under-voltage, and over-charge that may lead to hazardous situations such as thermal runaways. Amongst the BMS metrics is a determination of a state of charge (SOC) of the battery, which is a measurement of the available energy expressed as a percentage analogous to a fuel gauge of a gas tank. SOC estimation is a crucial aspect of BMS to ensure safety and performance. The battery should only be used in its safe zone and if SOC estimation is inaccurate, the battery could be overcharged or over-discharged which could lead to fault such as thermal runaway or capacity degradation. Furthermore, if the SOC is inaccurate, it provides erroneous remaining driving range information to the operator. Having a reliable SOC estimation is therefore essential.

In a typical BMS implementation, an SOC estimator is embedded on hardware for each battery cell with sensors and model parameters saved in a logbook. Typically, an EV battery pack contains about one hundreds cells for a nominal voltage of about 400 Volts (V). Due to fast charging market requirements, the trend is to increase the pack voltage to about 800V with more than 200 cells, each cell requiring its own SOC computation. Consequently, the numbers of mathematical operations required for the SOC estimators has increased with the number of cells.

The most advanced conventional techniques are model-based estimator techniques that are based on the Extended Kalman Filter (EKF). Different approaches can be found for EKF but the standard in the industry is the linear time invariant (LTI) EKF. A significant drawback of EKF is that it is computationally intensive and must be performed in a continuous manner for accurately tracking the SOC of the battery. Another drawback of EKF is that it must know many of the parameters of the battery cells such as internal resistance, dynamic resistance, dynamic capacitance, and capacity. Such battery parameters may be obtained in a laboratory before placing the cell into the battery pack. Yet another drawback is that EKF must know the initial state of SOC of the battery before starting predictions. If the initial state of SOC is unknown or potentially inaccurate, open-circuit voltage (OCV) measurements may be made while the battery is at rest which may be used to provide a rough initial state, and then a significant number of EKF measurement cycles may then be necessary to converge on an accurate SOC measurement.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A system and method of estimating the state of charge of battery as described herein uses a coulomb counting (CC) estimator with periodic calibration using an estimator based on artificial intelligence (AI). The CC estimator performs CC estimation by integrating battery current to essentially count charge over time. CC estimation achieves relatively high accuracy with very low computation consumption for a short period of time, but eventually de-calibrates itself and becomes less accurate. Before the error level of CC estimation rises above a tolerable level for each battery cell, AI estimation is performed to calibrate the cell to minimize the SOC error. In this manner, each cell of the battery is periodically calibrated using AI estimation (such as, for example, every 10 minutes or so), and then CC estimation is used to track the SOC for each battery cell until the next AI calibration. Although each AI estimation is relatively demanding in terms of computational resources, it is only used periodically to minimize SOC error that would otherwise accumulate over time using only CC estimation. SOC determination using combined AI and CC estimation as described herein is less computationally expensive than the conventional EKF technique yet achieves comparable or better accuracy over time.

Figure 1:
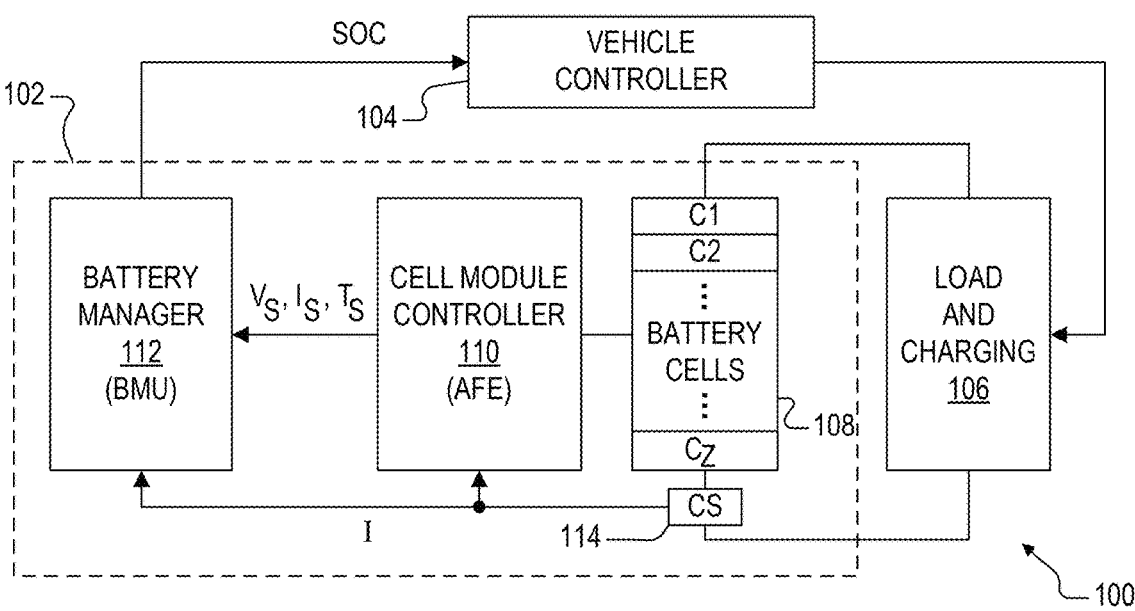
FIG. 1 is a simplified block diagram of a vehicle control system implemented according to one embodiment of the present disclosure.

FIG. 1 is a simplified block diagram of a vehicle control system 100 implemented according to one embodiment of the present disclosure. The vehicle control system 100 may be used by or within any vehicle that employs a rechargeable battery for power generation, such as electric vehicle (EV), a hybrid EV (HEV), a plug-in HEV (PHEV), etc. The illustrated vehicle control system 100 includes a battery pack 102, a vehicle controller 104, and a load and charging system 106. The load and charging system 106 generally represents any electrical or electronic systems of the vehicle receiving power from the battery pack 102, such as the vehicle motor, the braking system, steering system, instrument panels and displays, lighting systems, electronic control systems, etc. The load and charging system 106 may also include any electrical or electronic systems used for charging the battery 108 from internal or external power sources. The vehicle controller 104 is shown separately but may be part of the load and charging system 106, and may include controls manipulated by a driver of the vehicle, such as the gas pedal, brake pedal, steering wheel, etc.

The battery pack 102 includes a battery 108, a cell module controller (CMC) 110, and a battery manager 112. The battery 108 includes "Z" battery cells, shown as C1, C2, . . . , $C_Z$, in which Z is any suitable integer number for the given application. The battery cells are generally coupled in series, although it is understood that one or more cells may also be coupled in parallel. The number of battery cells Z may vary depending upon the particular application or configuration, such as, for example, Z=100 cells, although any number of cells more or less than 100 is contemplated. In the illustrated embodiment, the battery 108 is coupled to the load and charging system 106 and a separate current sensor (CS) 114 is shown in the current path for measuring battery current and providing current information Ito the CMC 110 and the battery manager 112. The CS 114 may be any type of current sensing device. In one embodiment, the CS 114 may be a current sense resistor in which the I current information may be provided as a voltage across the current sense resistor.

The CMC 110 may include an analog front end (AFE) or the like that monitors parameters of each of the battery cells including cell voltage and cell temperature. In one embodiment, cell voltage and temperature along with the current information I are sampled on a regular basis and corresponding $V_S$, $I_S$, and $T_S$ samples are provided to the battery manager 112. It is noted that the $V_S$, $T_S$, and $I_S$ samples are synchronized with each other (or at least the $V_S$ and $I_S$ samples), meaning that corresponding voltage, current and temperature sample values are taken at substantially the same time to provide a coherent sample data set. The battery manager 112 may also be referred to as a battery management unit (BMU) that contains other subsystems (not shown). In one specific configuration, $V_S$, $T_S$, and $I_S$ samples may be provided every 100 milliseconds (ms) although they may be provided at a lower rate or a higher rate depending upon the particular implementation (e.g., every 10 ms or the like). A primary function of the battery manager 112 is to use the voltage, current and temperature information to estimate the state of charge (SOC) of the battery 108 for making charging and discharging decisions.

Figure 2:
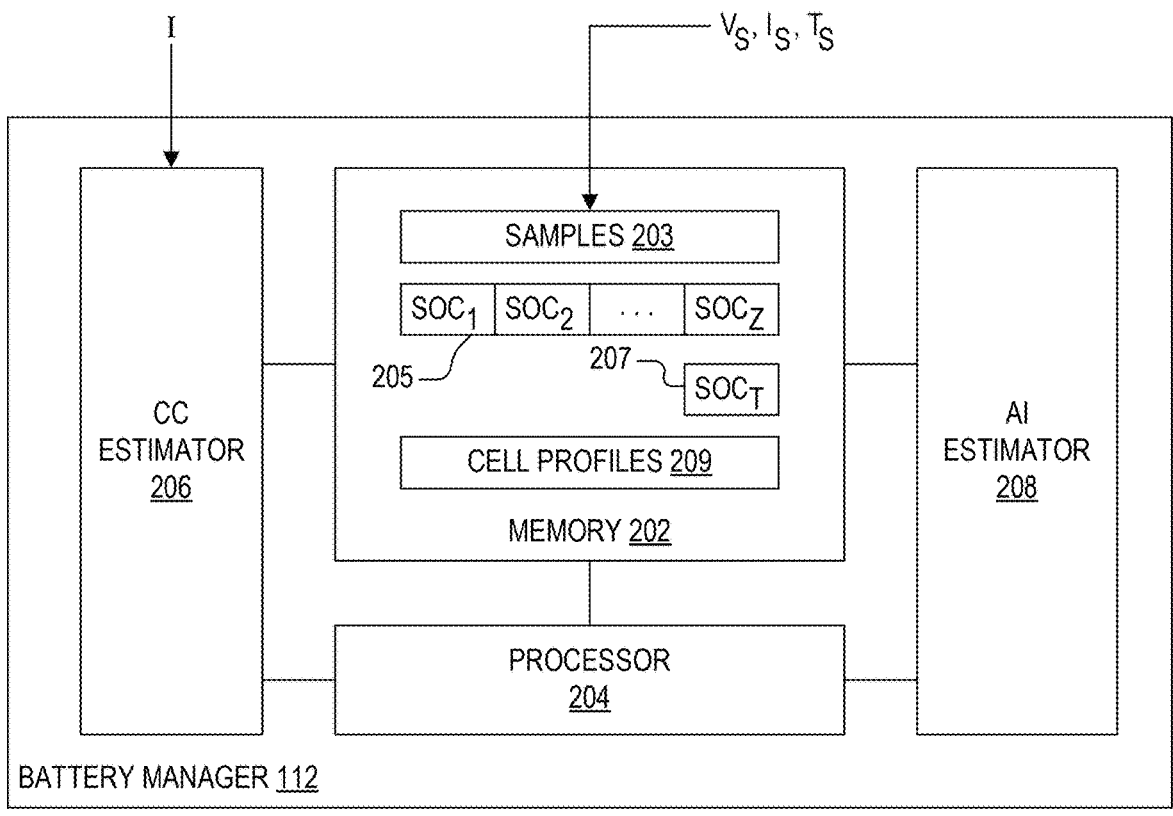
FIG. 2 is a simplified block diagram of the battery manager of FIG. 1 according to one embodiment of the present disclosure.

FIG. 2 is a simplified block diagram of the battery manager 112 according to one embodiment of the present disclosure. The battery manager 112 includes a memory 202 coupled to a processor 204, which are both coupled to a coulomb counter (CC) estimator 206 and an artificial intelligence (AI) estimator 208. The CC estimator 206 and the AI estimator 208 are used to make SOC estimations for each battery cell, in which the battery manager 112 combines individual cell SOC estimations for making an SOC estimation of the battery 108. The $V_S$, $T_S$, and $I_S$ samples may be stored within a sample section 203 of the memory 202 for use by the estimators, particularly the AI estimator 208. The memory 202 may include a cell SOC section 205 for storing SOC estimations for the Z battery cells, individually shown as $SOC_1$, $SOC_2$, . . . , $SOC_Z$. The memory 202 may further include a total SOC location 207 for storing a value $SOC_T$ indicating the total SOC for the entire battery 108. In one embodiment, $SOC_T$ is simply the sum of the individual cell SOC values, or $SOC_T = SOC_1 + SOC_2 + . . . , SOC_Z$.

The memory 202 may include any combination of any type of random access memory (RAM) devices, read-only memory (ROM) devices, registers, and other types of memory or storage devices. The processor 204 may be implemented as any type of processor, processing system, or processing circuitry, including, for example, a microcontroller unit (MCU), a microprocessor, etc. The CC estimator 206 and the AI estimator 208 may each be implemented in any one of several different manners. In one embodiment, for example, each may be implemented as separate circuitry for performing the associated SOC estimation functions as further described herein. In another embodiment, each represents code or application software or the like incorporating CC or AI algorithms stored within the memory 202 for execution by the processor 204. When the processor 204 is programmed with the CC application and performing CC functions, it may be considered as CC circuitry or a special purpose CC processing device. Similarly, when the processor 204 is programmed with the AI application and performing CC functions, it may be considered as AI circuitry or a special purpose AI processing device.

In general operation according to one embodiment, the $V_S$, $I_S$, and $T_S$ sample values for each of the cells of the battery 108 are received and stored within the cell SOC section 205 of the memory 202 on a regular or periodic basis. In one embodiment, the current information I from the CS 114 may be directly provided to the CC estimator 206 as shown which may sample the I value at a higher rate suitable for coulomb counting. Alternatively, the CC estimator 206 may simply use the $I_S$ samples stored in the memory 202. The processor 204 performs management functions including invoking either the CC estimator 206 or the AI estimator 208 for determining and tracking the SOC of each battery cell, and also for determining and updating the total SOC value $SOC_T$ for the battery 108. AI estimation is computationally expensive and is only used periodically to calibrate the SOC of each cell of the battery 108, and then to update the corresponding value $SOC_1$-$SOC_Z$. Once calibrated, the CC estimator 206 is used to track the SOC of each cell until calibration is needed as further described herein. The CC estimator 206 estimates SOC with high accuracy albeit at a substantially lower computational cost using a previous SOC state and integration of the current through the battery

108. The CC estimator 206, however, de-calibrates itself over time due to noise in current measurements and parasitic reactions in the battery 108.

The CC estimator 206 integrates the current information I over a period of time to get the charge that has been added or consumed during each period in which CC estimation is invoked. The memory 202 may store cell profiles 209 that includes information for each of the battery cells $C_1$-$C_Z$, in which the CC estimator 206 uses the cell profiles 209 to update the corresponding $SOC_1$-$SOC_Z$ value for each cell. The amount of charge that has been added or removed can then be added to or subtracted from the previous SOC value according to the following equation (1):

$$SOC(t + dt) = SOC(t) - \frac{\eta \left( \int_t^{t+dt} I(t)dt \right)}{Q_n} \tag{1}$$

in which "$\eta$" corresponds to the equivalent columbic efficiency. CC estimation performed by the CC estimator 206 is a basic coulomb counting method that does not use a significant amount of computational resources. The CC estimator 206, however, only increases or decreases the existing SOC state for each battery cell provided in the cell SOC section 205, so that if the existing SOC state is erroneous (such as, for example, if there is an initial gap between the SOC value and the actual SOC state of the cell), the CC estimator 206 is not able to or otherwise does not attempt to correct it. In addition, the CC estimation performed by the CC estimator 206 is relatively simplistic and suffers from current measurement noise and may not take into account parasitic reactions and internal temperature of the cells of the battery 108. In summary, the CC estimator 206 only tracks changes of SOC, and even then remains sufficiently accurate for tracking SOC changes only for a limited amount of time.

As described further herein, the AI estimator 208 operates according to a previously trained model with supervised learning. Such training may be performed offline such as by a manufacturer or the like. During training, inputs are fed into an AI model and knowing which outputs the model is to find, it updates programmable parameters including weight and bias coefficients (or "neurons") and may become as accurate as desired. Once trained, the programmable parameters may be stored into the memory 202 (see, e.g., FIG. 8, coefficient values COEFF1-COEFFy) and used by the AI estimator 208 during operation. Additional training may be performed offline from time to time to adjust the programmable parameters, which may updated the values stored in the memory 202 during a software update or the like.

The AI estimator 208 is an AI-based engine configured according to a selected AI architecture. Different AI architectures are available, such as multilayer perceptron (MLP), convolutional neural network (CNN), recurrent neural network (RNN), long short-term memories (LSTM), among others. The LSTM architecture is similar to RNN except including a memory cell. Each AI architecture has certain advantages and disadvantages so that the appropriate AI method is selected and implemented by the AI estimator 208 to provide the sufficient accuracy for a given configuration. Essentially the AI estimator 208 processes sequences or time-series of data. The LSTM architecture allows the network to avoid the vanishing gradients problem and remembers data that has been provided for awhile. Simple RNN may forget data after a while whereas the memory cell used by LSTM enables longer term memory and remembers relevant information for a longer period of time. The present disclosure, however, is not limited to any particular AI architecture.

Figure 3:
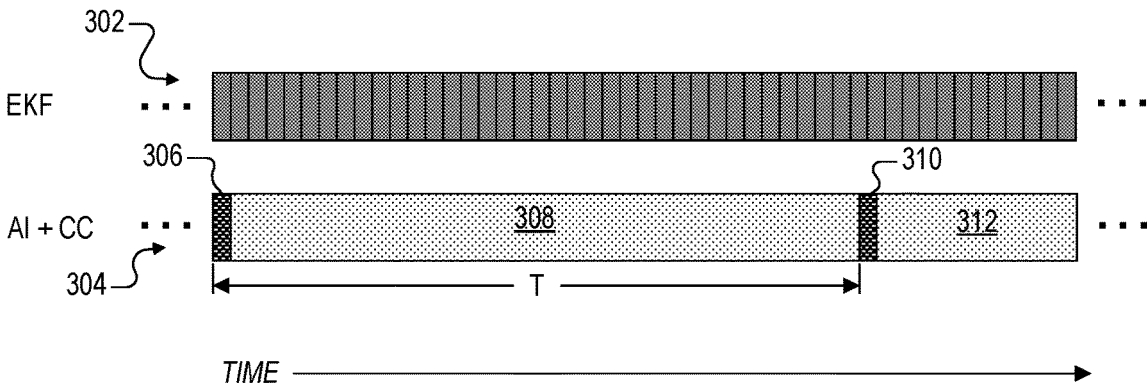
FIG. 3 is a pair of timing diagrams generally comparing SOC estimation of a single battery cell using EKF prediction versus SOC estimation of the cell using both the AI estimator and the CC estimator of FIG. 2 according to one embodiment of the present disclosure.

FIG. 3 is a pair of timing diagrams generally comparing SOC estimation of a single battery cell using EKF prediction (EKF) versus SOC estimation of the cell using both the AI estimator 208 and the CC estimator 206 (AI +CC) according to one embodiment of the present disclosure. The EKF SOC estimation is illustrated by the upper timing diagram shown at 302 in which time is divided into roughly equivalent sequential time segments and in which each time segment is shown as a shaded rectangle. The duration of each time segment corresponds that the sample data rate of the $V_S$, $T_S$, and $I_S$ samples. For example, if the samples are taken and stored at a rate of 100 ms, then each time segment is also about 100 ms. The EKF prediction method is performed during each consecutive time segment for both determining and tracking the SOC of the cell over time. Although the EKF prediction method is very accurate, it is also very computationally expensive and thus consumes a substantial amount of processing power and corresponding energy over time.

The combined AI and CC estimation is illustrated by the lower timing diagram shown at 304. Each AI segment is shown as a rectangle with darker shading and also corresponds with the sample data rate of the $V_S$, $T_S$, and $I_S$ samples. CC estimation is shown within a rectangular area with light shading. It is noted that CC estimation may also be divided into similar time segments such as in cases in which the Is samples are used. As previously described, however, CC estimation may use a higher rate of sampling and thus may be depicted as an elongated continuous segment as shown. The AI estimator 208 initially calibrates the state of the SOC of the cell during an initial AI segment 306, and then CC estimation is performed by the CC estimator 206 for a subsequent time period as shown at 308. After a predetermined MAX CC time period T starting at the beginning of the first AI segment 306, the AI estimator 208 is once again invoked for a subsequent AI segment 310 to recalibrate the SOC of the cell, followed by another CC time period 312 during which time the CC estimator 206 is once again invoked to track the SOC using CC estimation. Operation may repeat in this manner over time alternating between AI estimation calibration segments and CC estimation time periods.

SOC estimation using the AI estimator 208 is computationally expensive but is also very accurate and is able to determine an initial accurate estimation of the SOC of the cell. In contrast with the EKF estimation, however, the AI estimator 208 is not used for consecutive time segments but instead is only performed periodically for a single time segment when the CC estimator 206 needs re-calibration. In summary, AI estimation is performed for calibration, followed by CC estimation to track SOC over time, only to be interrupted periodically by AI estimation to recalibrate the SOC of the cell before any error of CC estimation grows above a predetermined maximum allowable error threshold level.

The predetermined time period T may be empirically determined for a given configuration based on the relative accuracy of CC estimation. The amount of error of the CC estimator 206 grows over time so that it eventually de-calibrates itself and becomes inaccurate. For each battery configuration, an acceptable error threshold is determined and before this threshold is reached or exceeded during CC estimation, another AI calibration session is performed by the AI estimator 208 to minimize error, and then CC operation performed by the CC estimator 206 is resumed. In one specific embodiment, for example, the period T may be about 10 minutes, although the actual period for a given configuration may be adjusted as needed. In comparison with the EKF prediction method, the combined AI and CC estimation remains sufficiently accurate while using significantly less amount of processing power over time.

Figure 4:
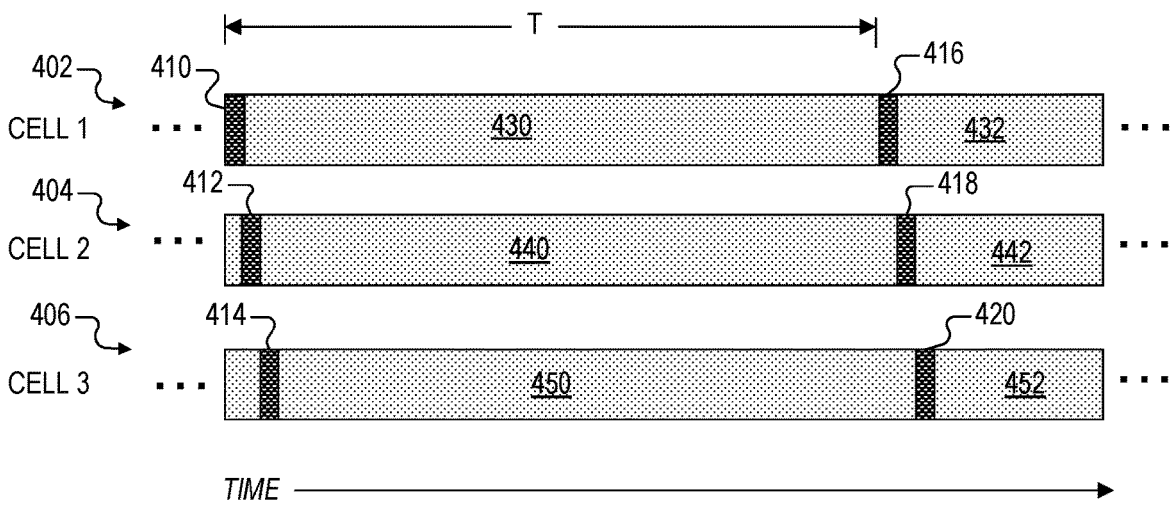
FIG. 4 is a series of timing diagrams generally illustrating balancing of AI processing over time for multiple battery cells according to one embodiment of the present disclosure.

FIG. 4 is a series of timing diagrams generally illustrating balancing of AI processing over time for multiple battery cells according to one embodiment of the present disclosure. The hardware processing circuitry implementing the AI estimator 208 and responsible for running the inference AI model may be overloaded if too many of the cells were AI calibrated at the same time. Alternatively, the AI estimator 208 could be over-designed to allow a significant number of simultaneous AI calibrations, which would be inefficient. Instead, the AI estimator 208 performs AI calibration only for one cell at a time, or possibly for a small or limited number of cells at the same time depending upon hardware capabilities. The combined AI and CC estimation is illustrated for a first cell by a first timing diagram shown at 402, for a second cell by a second timing diagram shown at 404, for a third cell by a third timing diagram shown at 406, and so on. Operation is similar for the additional cells of the battery.

The AI estimator 208 performs AI calibration for the first cell during a first AI segment 410 while SOC is tracked using the CC estimator 206 for the second and third cells (along with other cells up to all cells of the battery). When AI calibration is completed for the first cell, operation switches to the CC estimator 206 for the first cell during a subsequent CC time period 430 and then AI calibration is performed by the AI estimator 208 for the second cell during a second AI segment 412. When AI calibration is completed for the second cell, operation switches to the CC estimator 206 for the second cell during a subsequent CC time period 440 and AI calibration is performed by the AI estimator 208 for the third cell during a third AI segment 414. When AI calibration is completed for the third cell, operation switches to the CC estimator 206 for the third cell during a subsequent CC time period 450 and then AI calibration is performed by the AI estimator 208 for a next cell (not shown), and so on. Operation continues in this manner until each battery cell has been calibrated.

After the predetermined time period T, operation wraps around back to the first cell and AI calibration is performed again for the first cell as shown by AI segment 416, followed by a CC time period 432, then an AI segment 418 for the second cell, followed by a CC time period 442, then an AI segment 420 for the third cell, followed by a CC time period 452, and so on in which operation repeats to recalibrate the remaining cells one at a time. It is noted that although CC estimation is shown in FIG. 4 on a per-cell basis, the CC estimator 206 generally performs CC estimation to continuously track charge changes to update the SOC states for the other battery cells that are not being calibrated. CC estimation is paused for any one or more cells being calibrated, and then resumed after calibration is completed.

In alternative embodiments, AI calibration may be distributed among the battery cells in any suitable manner so long as calibration is performed on only one cell or a limited number of cells at a time. The overall MAX CC time period T may also be configured or reconfigured as separate periods per cell. In addition, the overall MAX CC time period T (collectively or a separate time period for each cell) may by dynamically configured over time depending on external conditions (e.g. outdoor temperature, driving style, etc.), in order to space out the AI recalibration processes to further save power, whenever possible, while making sure to keep the SOC error below a requirement threshold.

In this manner, it is appreciated that AI calibration processing is only performed one cell at a time (or only on a limited number of cells simultaneously) to update the SOC value for only those cells being calibrated to spread AI processing load over time and relax hardware requirements of the AI estimator 208. In addition, AI calibration by the AI estimator 208 is kept at a minimum and performed only when necessary to recalibrate the cells between successive SOC estimations performed by the CC estimator 206. It is noted that if the number of cells was such that the predetermined period T expires prior to completion of AI calibration for all of the cells of the battery, that more than one AI calibration may need to be performed to keep SOC error below the predetermined error threshold for each of the battery cells. In any case, the amount of AI processing performed by the AI estimator 208 is kept to a minimum and used only when calibration is needed to avoid SOC error for any cell from rising above the predetermined error threshold.

Figure 5:
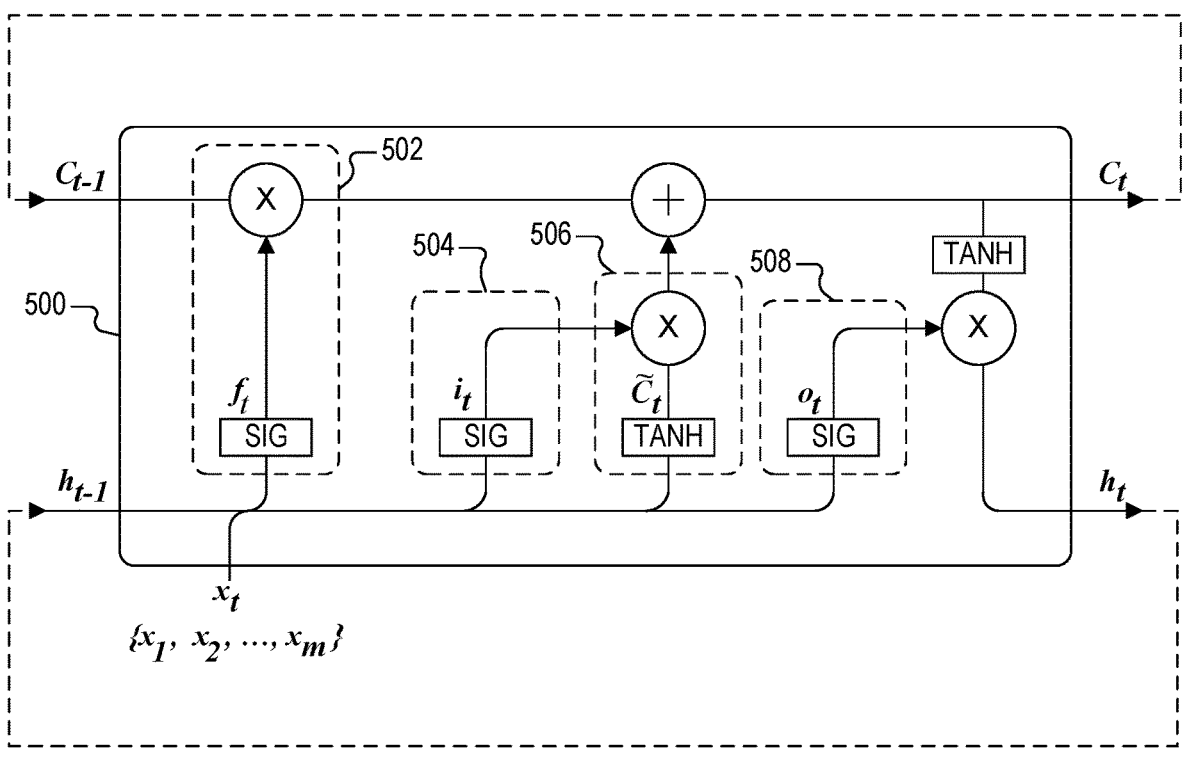
FIG. 5 is a block diagram of an LSTM cell which may be used within the AI estimator of FIG. 2 configured according to one embodiment of the present disclosure.

FIG. 5 is a block diagram of an LSTM cell 500 which may be used within the AI estimator 208 configured according to one embodiment of the present disclosure. The LSTM cell 500 includes a forget gate 502 that determines a forget variable "f" based on a cell state variable "h" and a data input variable "x" that essentially decides what information is not relevant from previous steps, an input gate 504 that determines an input variable "i" based on the variables h and x that essentially decides what information is relevant to add from the current step, a memory gate 506 that determines a candidate variable $\tilde{C}$ based on the variables h and x and used for determining a new memory variable C, and an output gate 508 that determines an output variable "o" based on the variables h and x and used for determining the next LSTM cell state variable h and the new memory variable C. The data input variable x includes scaled input sample elements for voltage V, temperature T, and current I. Each of the variables f, i, $\tilde{C}$, o, h, and x are vectors having a subscript based on a time index value "t" denoting increments of time from one state to the next. For example, $x_{t-1}$ denotes the previous input data vector, $x_t$ denotes a current input vector, $x_{t+1}$ denotes the next input data vector, and so on. Functional boxes labeled "sig" denote the sigmoid function "σ" which ranges from 0 to 1. Functional boxes labeled "tanh" denote the hyperbolic tangent function "tanh" which ranges from −1 to 1. The LSTM cell 500 is programmed with weight coefficient matrices $W_f$, $W_i$, $W_c$, and $W_o$, and bias coefficient matrices $b_f$, $b_i$, $b_c$, and $b_o$ retrieved from the memory 202 that were determined beforehand by training or the like (and that may be updated from time to time).

The forget vector variable $f_t$ within the forget gate 502 is determined according to the following equation (2):

$$f_t = \sigma(W_f \cdot [h_{t-1}, x_t] + b_f) \tag{2}$$

in which the dot "·" denotes multiplication, and the brackets "[ ]" denote vector concatenation, such as when the prior vector variable $h_{t-1}$ is concatenated with the current input data vector $x_t$. The input vector variable $i_t$ within the input gate 504 is determined according to the following equation (3):

$$i_t = \sigma(W_i \cdot [h_{t-1}, x_t] + b_i) \tag{3}$$

The candidate vector variable $\tilde{C}_t$ within the memory gate 506 is determined according to the following equation (4):

$$\tilde{C}_t = \tanh(W_C \cdot [h_{t-1}, x_t] + b_c) \tag{4}$$

The new memory vector variable $C_t$ at the output of the LSTM cell 500 is determined according to the following equation (5):

$$C_t = f_t * C_{t-1} + i_t * \tilde{C}_t \qquad (5)$$

The output vector variable $o_t$ from the output gate 508 is determined according to the following equation (6):

$$o_t = \sigma(W_o \cdot [h_{t-1}, x_t] + b_o) \qquad (6)$$

The cell state vector variable $h_t$ at the output of the LSTM cell 500 is determined according to the following equation (7):

$$h_t = o_t * \tanh(C_t) \qquad (7)$$

In operation for a single LSTM layer, the LSTM cell 500 is first initialized and programmed with the weight coefficient matrices $W_f$, $W_i$, $W_c$, and $W_o$, and bias coefficient matrices $b_f$, $b_i$, $b_c$, and $b_o$. In addition, the $C_{t-1}$ and $h_{t-1}$ values may each initially be set to 0 or may be set to some other initial or default value, such as $C_0$ and $h_0$. Then the set of scaled input data vectors $x_1$, $x_2$, . . . , $x_m$ are input to the LSTM cell 500, one input data vector at a time, in which "m" denotes the total number of input data vectors for a particular configuration. For each iteration, the first or next input data vector $x_t$ is concatenated with the prior (or initial) cell state variable $h_{t-1}$ and the combined value is applied to each of the gates 502, 504, 506, and 508 and a new memory variable $C_t$ and a new cell state variable $h_t$ are calculated according to the equations (2)-(7). The new variables $C_t$ and $h_t$ are fed back as the prior variables $C_{t-1}$ and $h_{t-1}$ for the next iteration using the next input data vector $x_{t+1}$, and operation repeats in this manner for each of the m input data vectors. For example, the first input data vector $x_1$ is concatenated with $h_0$ and applied to the LSTM cell 500 to calculate $C_1$ and $h_1$ for the first iteration, which are fed back to the inputs of the LSTM cell 500 for the second iteration, in which the second input data vector $x_2$ is concatenated with $h_1$ and applied to the LSTM cell 500 to calculate $C_2$ and $h_2$, which are fed back to the inputs of the LSTM cell 500 for the third iteration, and so on for each of the m input data vectors $x_1$-$x_m$. The $h_m$ vector value is provided as the final output value for the single LSTM layer.

The process is similar for a bidirectional LSTM layer, except that the process performed by the LSTM cell 500 is repeated in the reverse direction using a different set of the weight coefficient matrices $W_f$, $W_i$, $W_c$, and $W_o$, and bias coefficient matrices $b_f$, $b_i$, $b_c$, and $b_o$, and then the forward and reverse output values are combined or averaged to provide a final $h_{m\_b}$ vector value. Thus, in the first m iterations the input vector values $x_1$, $x_2$, . . . , $x_m$ are applied one by one, and in the next m iterations the input vector values $x_m$, $x_{m-1}$, . . . , $x_1$ are applied one by one (i.e., in reverse order).

Figure 6:
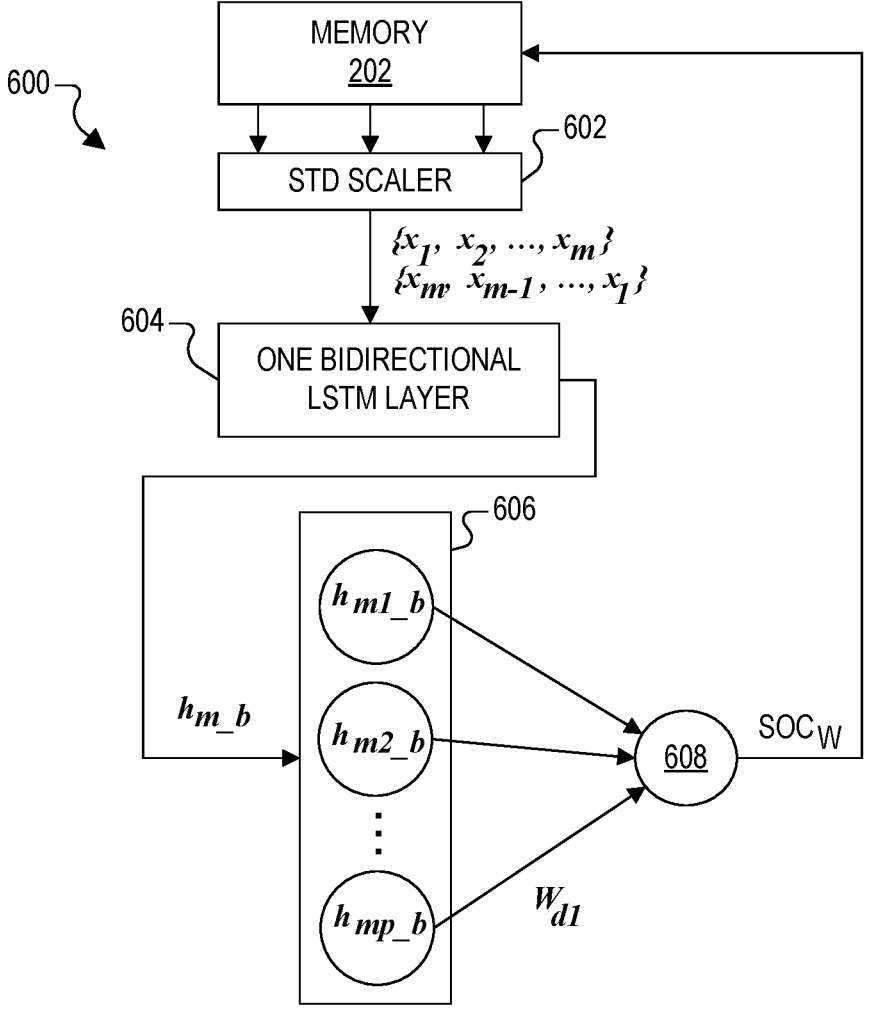
FIG. 6 is a simplified block diagram of an AI model that may be used by the AI estimator of FIG. 2 according to one embodiment of the present disclosure.

FIG. 6 is a simplified block diagram of an AI model 600 that may be used by the AI estimator 208 according to one embodiment of the present disclosure. The $V_S$, $T_S$, and $I_S$ sample values of an applicable battery cell are stored into the memory 202 at a certain rate, such as every 10 ms or 100 ms or the like, and then used to form the elements of the data input vectors $x_t = x_1 - x_m$. When AI calibration is to be performed, the AI model 600 is first initialized to its default values and states (such as by loading previously determined weights and bias values from the memory 202). The AI model 600 includes an LSTM cell 500 configured in a bidirectional manner that has been previously trained with a significant number of data samples during multiple epochs with a selected optimizer and a decaying learning rate. In one embodiment, for example, the AI model 600 may be trained with 6-7 million $V_S$, $T_S$, and $I_S$ data samples during 30-40 epochs with an Adam Optimizer and a decaying learning rate. The training is used to determine the weight coefficient matrices $W_f$, $W_i$, $W_c$, and $W_o$, and the bias coefficient matrices $b_f$, $b_i$, $b_c$, and $b_o$ in both the forward and reverse directions for the bidirectional case, along with an additional weight vector $W_{d1}$ used for calculating the final SOC value as further described herein. The elements of each of these weight and bias coefficient matrices determined during prior training are stored into a non-volatile portion of the memory 202 (e.g., type of programable ROM or the like). Upon initialization before each calibration process, these values are loaded from the memory 202 into the storage elements within the AI model 600.

In one embodiment after initialization including loading the weight and bias coefficient matrices for the forward direction, each set of raw data input sample values for a corresponding battery cell stored in the memory 202 are provided to corresponding inputs of standard (STD) scaler circuitry 602, which scales each of the samples into a normalized vector value incorporated into a corresponding input data vector $x_t$. For example, at a time t, the raw voltage samples may be denoted $V_t$, the raw temperature samples may be denoted $T_t$, and the raw current samples may be denoted $I_t$. For a given battery cell for a selected period of time during which m samples are stored, the raw data input values are $V_1$-$V_m$ for voltage, $T_1$-$T_m$ for temperature, and $I_1$-$I_m$ for current. The STD scaler circuit 602 computes the mean and standard deviation for each $V_S$, $T_S$, and $I_S$ data set, subtracts the mean value from each sample value, and divides the result by the corresponding standard deviation to generate a corresponding input data vector $x_t = (v_t, t_t, i_t)$, in which the $v_t$, $t_t$, $i_t$ are scaled values according to the standard scaler operation. Thus, the scaled input vector data values are $x_1 = (v_1, t_1, i_1)$, $x_2 = (v_2, t_2, i_2)$, . . . , $x_m = (v_m, t_m, i_m)$.

The scaled input vector values $x_1$-$x_m$ are provided one at a time to a bidirectional LSTM layer 604, which incorporates the LSTM cell 500 configured in a bidirectional manner. The LSTM cell 500 is updated with each iteration until forward AI cell state variable $h_{mf}$ vector value is determined. The weight and bias coefficient matrices for the reverse direction are then loaded into the LSTM cell 500 of the bidirectional LSTM layer 604, and the scaled input vector values are provided one a time in the reverse direction, or $x_m$-$x_1$, to determine a reverse AI cell state variable $h_{mr}$ vector value. The $h_{mf}$ and $h_{mr}$ vector values are then combined to determine the final bidirectional output vector value $h_{m\_b}$. The number of iterations m for each forward and reverse pass depends upon the particular configuration and implementation. In one embodiment, for example, "A" seconds of $x_t$ input data values are iteratively processed through the LSTM layer 604 in each direction, in which each iteration is provided every "B" ms. In a particular configuration, A=7 seconds of input data is processed every B=100 ms for a total of m=70 iterations for each direction. It is understood, however, that any number of iterations may be selected for a given configuration.

The final cell state variable $h_{m\_b}$ vector value is sored within a linearizer 606 that forms a linear combination of the elements, shown as $h_{m1\_b}$, $h_{m2\_b}$, . . . , $h_{mp\_b}$ for a total of "p" elements. Each cell state vector element $h_{m1\_b}$-$h_{mp\_b}$ is then multiplied by a corresponding one of p weight values of the weight vector $W_{d1}$, and each multiple is added together by a converter 608, which outputs a final $SOC_W$ value for the applicable battery cell of the battery 108, in which "W" denotes an index from 1 to Z. The final $SOC_W$ value may then be used to update a corresponding one of the $SOC_1$-$SOC_Z$ values of the cell SOC section 205 in the memory 202. Once a cell is calibrated, CC estimator 206 resumes accurate tracking of changes in charge for that cell to update the corresponding SOC value until the cell is next calibrated.

Figure 7:
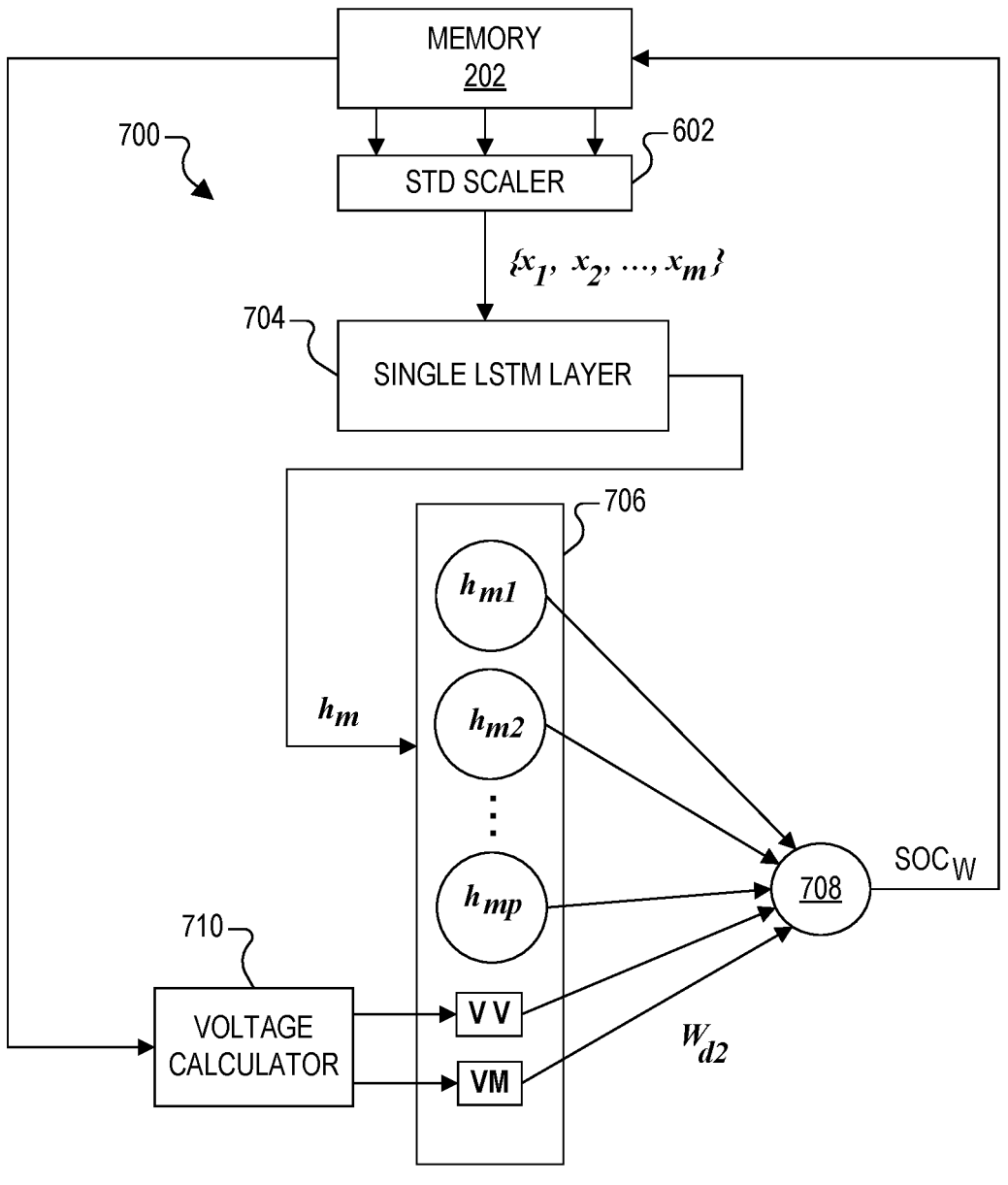
FIG. 7 is a simplified block diagram of another AI model that may be used by the AI estimator of FIG. 2 according to another embodiment of the present disclosure.

FIG. 7 is a simplified block diagram of another AI model 700 that may be used by the AI estimator 208 according to another embodiment of the present disclosure. The AI model 700 is substantially similar to the AI model 600, in which the bidirectional LSTM layer 604 is replace by a single LSTM layer 704, the linearizer 606 is replace by a similar linearizer 706, and the converter 608 is replaced by similar converter 708. The single LSTM layer 704 also includes the LSTM cell 500, yet configured with a simple or single layer for operation in only one direction (e.g., the forward direction). The LSTM cell 500 of the single LSTM layer 704 has also been previously trained in a similar manner previously described for the bidirectional cell, except that only one set of weights and bias values are determined and used. The AI model 700 further includes a voltage calculator 710 that retrieves corresponding voltage samples from the memory 202 and calculates and updates rolling averages of voltage variance and voltage mean. The voltage calculator 710 generates a voltage variance value VV and a voltage mean value VM that are stored as separate elements within the linearizer 706. The memory 202 stores the data samples and the STD scaler circuitry 602 is provided and operates in substantially the same manner to provide m scaled or normalized input vector data values $x_t = x_1, x_2, \ldots, x_m$.

When AI calibration is to be performed, the AI model 700 is first initialized to its default values and states including loading similar weight coefficient matrices $W_f$, $W_i$, $W_c$, $W_o$, and bias coefficient matrices $b_f$, $b_i$, $b_c$, and $b_o$ along with another, different weight vector $W_{d2}$ and from the memory 202. After initialization, the scaled input values xt are then provided one at a time as inputs to the LSTM cell 500 within the single LSTM layer 704 in one direction only. In this manner, the LSTM layer 704 is simplified in which the number of weights and the amount of processing as compared to the bidirectional LSTM layer 604 is divided by a factor of 2. The LSTM cell 500 within the single LSTM layer 704 is updated with each iteration until a final cell state variable $h_m$ vector value is determined and stored within the linearizer 706 including a linear combination of p elements, shown as $h_{m1}$, $h_{m2}$, $\ldots$, $h_{mp}$. The linearizer 706 further includes the VV and VM values calculated by the voltage calculator 710. Each cell state vector element $h_{m1}$-$h_{mp}$, VV, and VM are then multiplied by a corresponding one of p+2 weight values of the weight vector $W_{d2}$, and each multiple is added together by the converter 708, which outputs a final SOC value for the applicable battery cell of the battery 108. In this manner, the weight matrix $W_{d2}$ is similar to the weight matrix $W_{d1}$ except that weights are also provided for the rolling averages of voltage variance and voltage mean values VV and VM. Once again, the final $SOC_H$ value may then be used to update a corresponding one of the $SOC_1$-$SOC_Z$ values of the cell SOC section 205 in the memory 202. Once a cell is calibrated, CC estimator 206 resumes accurate tracking of changes in charge for that cell to update the corresponding SOC value until the cell is next calibrated.

The AI model 700 is significantly simplified with respect to the AI model 600 because a substantially reduced number of calculations are performed by the single LSTM layer 704, although the AI model 700 also incorporates the voltage variance and voltage mean values. The voltage mean is highly correlated with the SOC and a drop in SOC is correlated with changes in the voltage variance. This improvement boosts the performance of the AI model 700 as compared to the AI model 600 with substantially less number of calculations.

Figure 8:
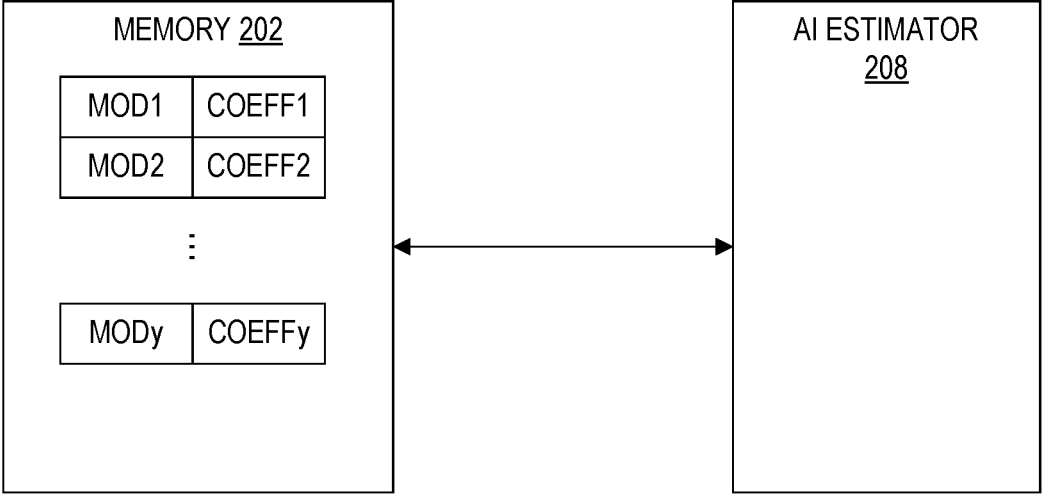
FIG. 8 is a simplified block diagram of the memory of FIG. 2 storing AI models and corresponding sets of weight and bias coefficients for the AI estimator of FIG. 2 according to one embodiment of the present disclosure.

FIG. 8 is a simplified block diagram of the memory 202 storing an integer number y of AI models MOD1, MOD2, ..., MODy and corresponding sets of weight and bias coefficients COEFF1, COEFF2, ..., COEFFy for the AI estimator 208 according to one embodiment of the present disclosure. The AI estimator 208 may be configured to be programmed according to any number AI models and corresponding coefficients (e.g., AI model 600 or 700 or other). Although the same AI model may be used for each of the battery cells of the battery 108, one or more of the battery cells may be differently configured or positioned within the battery 108, such that a different AI model may be used for different battery cells.

Figure 9:
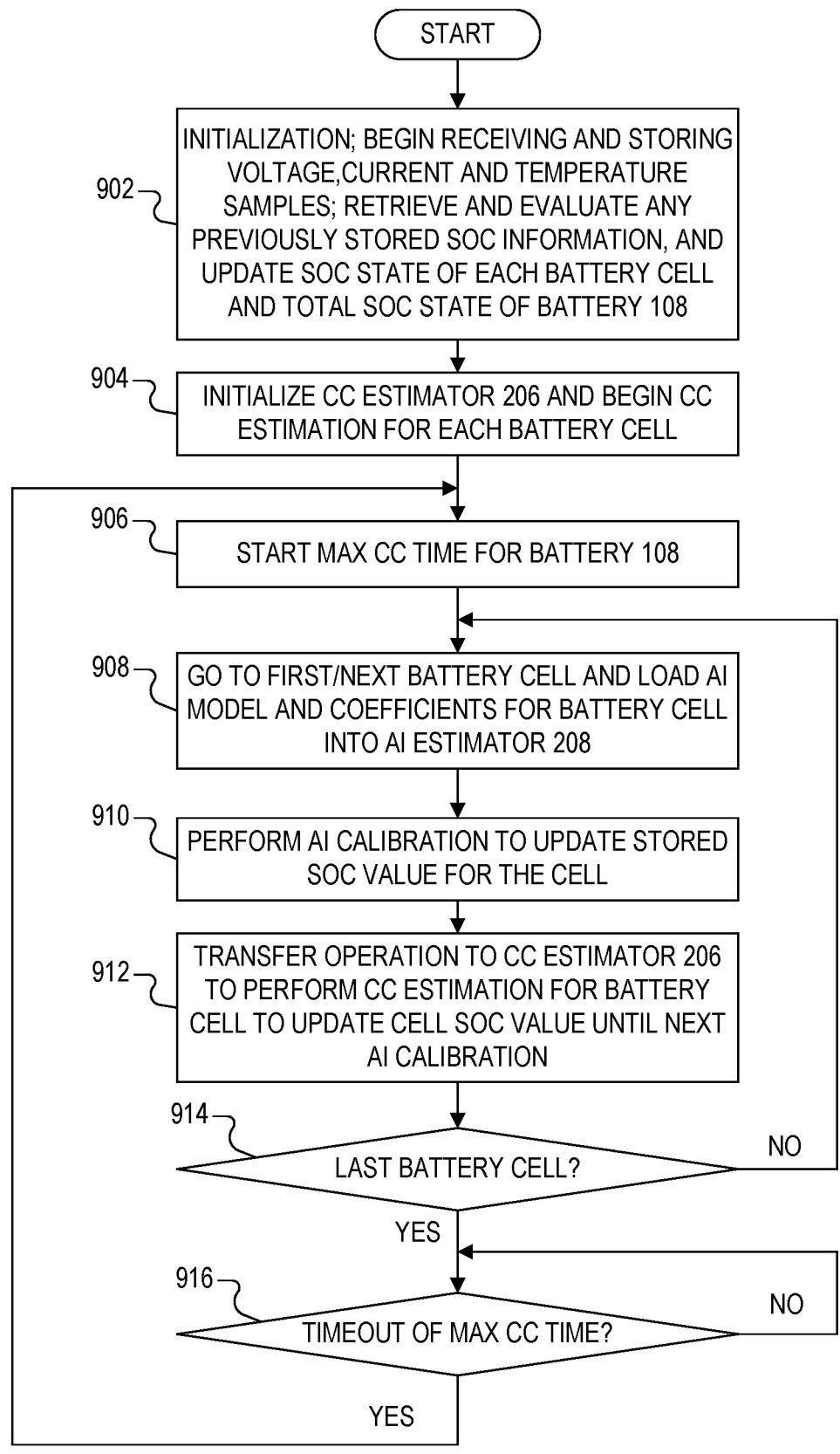
FIG. 9 is a flowchart diagram illustrating operation of the battery manager of FIG. 1 according to one embodiment of the present disclosure.

FIG. 9 is a flowchart diagram illustrating operation of the battery manager 112 according to one embodiment of the present disclosure. At a first block 902, the battery manager 112 is initialized, such as at power-up or reset, and a battery check procedure or the like is performed to determine an initial state of the battery 108. The CMC 110 is also initialized and the battery manager 112 begins receiving and storing voltage, current, and temperature samples. In addition, and previously stored SOC information of the battery cells or OCV information may be retrieved and evaluated for making an initial rough estimation of SOC for each cell and for the total SOC state of the battery 108. The $SOC_1$-$SOC_Z$ values along with $SOC_T$ may then be initialized accordingly by the processor 204. Previously stored voltage and SOC information may be accessed but is usually not relied upon since the battery manager 112 may have been inoperative for an unknown period of time. In one embodiment, even when the vehicle control system 100 is turned off for a period of time, the battery manager 112 may remain active at least in a limited capacity, such as continuous CC estimation of each of the battery cells over time. In addition or in the alternative, OCV information may be tracked over time for making initial rough SOC estimations.

At next block 904, if not already initialized and operating, the CC estimator 206 is initialized and CC estimation is started or continued for each of the battery cells. Although the SOC updates to $SOC_1$-$SOC_Z$ values along with $SOC_T$ may be accurate for a while using CC estimation, any initial errors are not corrected until calibration. Operation advances to next block 906 in which a global MAX CC time is started for the battery 108. In an alternative embodiment, a timer may be initialized on a per-cell basis. At next block 908, operation advances to the first battery cell (for first iteration) or the next battery cell (for each subsequent iteration) and an AI model and corresponding coefficients for the battery cell are loaded into the AI estimator 208. This essentially initializes the AI estimator 208 although any other initialization may be performed at this time. Operation advances to next block 910 in which the AI estimator 208 performs AI calibration to update the SOC value for the current battery cell. In this manner, any initial SOC errors of the cell are minimized. Operation advances to next block 912 in which SOC operation is transferred to the CC estimator 206 for the current battery cell to update SOC value for that cell until the next AI estimation. The CC estimator 206 then continues SOC estimation for the battery cell.

Operation advances to next block 914 in which it is queried whether the battery cell is the last one in the battery 108. If not, operation loops back to block 908 to repeat blocks 908, 910, and 912 for the next battery cell of the battery 108. If calibration has been performed for each of the battery cells, operation advances instead to block 916 to query whether the MAX CC time has timed out. At this point in time, AI calibration has been performed for each of the battery cells so that any initial errors of the $SOC_1$-$SOC_Z$ values and thus the $SOC_T$ value are minimized and are now accurately updated by CC estimation until expiration of the MAX CC time. The MAX CC time is the maximum amount of time that CC estimation may be performed for each cell before the SOC estimate becomes inaccurate. If the MAX CC time has not expired, operation loops at block 916 until the MAX CC time expires. CC estimation continues to monitor each of the battery cells for accurately tracking SOC during the MAX CC time period. When the MAX CC time has expired, operation loops back to block 906 to restart the MAX CC time for the battery 108, and then operation advances to block 908 to begin the next round of AI calibrations for each of the battery cells.

Aspects of the disclosure are defined in the accompanying claims. In a first aspect, there is provided battery management system for tracking a state of charge of a battery which comprises a plurality of cells, comprising: a coulomb counter estimator that is configured to determine a charge difference over time for tracking changes of a state of charge of each of the plurality of cells of the battery and for updating a corresponding plurality of state of charge values;

an artificial intelligence estimator that is configured to convert a set of sample values of a selected one of the plurality of cells into an estimated state of charge of the selected cell; and a controller that is configured to periodically invoke the artificial intelligence estimator to calibrate the state of charge of each of the plurality of cells and to update each of the plurality of state of charge values.

In one or more embodiments, the coulomb counter estimator may be configured to integrate current through the plurality of cells over time and to use a plurality of cell profiles for updating the corresponding plurality of state of charge values. In one or more embodiments, the controller may be configured to invoke the artificial intelligence estimator to calibrate each of the plurality of cells, one at a time, before an error of the coulomb counter estimator reaches a predetermined error threshold. In one or more embodiments, the artificial intelligence estimator may comprise Long Short-Term Memories. In one or more embodiments, the artificial intelligence estimator may be configured to use a plurality of coefficients that were previously determined by pretraining over a plurality of cycles. In one or more embodiments, the plurality of coefficients may comprise a plurality of weight values and a plurality of bias values. In one or more embodiments, the set of sample values may comprise synchronized voltage, current, and temperature samples taken over a period of time during operation of the battery. In one or more embodiments, the artificial intelligence estimator may comprise: a bidirectional Long Short-Term Memory layer that is configured to convert scaled input vector data values into a plurality of state vector elements; a linearizer that is configured to form a linear combination of the plurality of state vector elements; and a converter that is configured to multiply each of the plurality of state vector elements by a corresponding one of a plurality of weight values and to combine resulting factors into a final state of charge value used to update a corresponding one of the plurality of state of charge values.

In one or more embodiments, the artificial intelligence estimator may comprise: a single Long Short-Term Memory layer that is configured to convert scaled input vector data values into a plurality of state vector elements; a voltage calculator that is configured to convert the set of sample values into a voltage variance value and a voltage mean value; a linearizer that is configured to form a linear combination of the plurality of state vector elements, the voltage variance value and the voltage mean value; and a converter that is configured to multiply each of the plurality of state vector elements, the voltage variance value and the voltage mean value by a corresponding one of a plurality of weight values and to combine resulting factors into a final state of charge value used to update a corresponding one of the plurality of state of charge values. In one or more embodiments, the artificial intelligence estimator may be configured to load one of a plurality of artificial intelligence models and a corresponding one of a plurality of coefficients to calibrate a corresponding one of the plurality of cells of the battery.

In a second aspect, there is provided a method of tracking a state of charge of a battery which comprises a plurality of cells, comprising: counting coulombs for determining a charge difference over time for tracking changes of a state of charge of each of the plurality of cells of the battery and updating a corresponding plurality of state of charge values; and periodically invoking an artificial intelligence based estimator for converting a set of sample values of a selected one of the plurality of cells to calibrate the selected cell and to update a corresponding one of the plurality of state of charge values.

In one or more embodiments, said counting coulombs may comprise integrating current through the plurality of cells over time and using a plurality of cell profiles for updating the corresponding plurality of state of charge values. In one or more embodiments, said periodically invoking an artificial intelligence based estimator may comprise invoking the artificial intelligence based estimator to calibrate each of the plurality of cells, one at a time, before an error of any one of the plurality of state of charge values reaches a predetermined error threshold. In one or more embodiments, said periodically invoking an artificial intelligence based estimator may comprise using a plurality of coefficients that were previously determined by pretraining over a plurality of cycles.

In one or more embodiments, said using a plurality of coefficients may comprise using a plurality of weight values and a corresponding plurality of bias values. In one or more embodiments, the method may further comprise taking synchronized voltage, current, and temperature samples over a period of time during operation of the battery. In one or more embodiments, said periodically invoking an artificial intelligence based estimator may comprise: converting scaled input vector data values into a plurality of state vector elements using a bidirectional Long Short-Term Memory layer; forming a linear combination of the plurality of state vector elements; and multiplying each of the plurality of state vector elements by a corresponding one of a plurality of weight values and combining resulting factors into a final state of charge value used to update a corresponding one of the plurality of state of charge values.

In one or more embodiments, said periodically invoking an artificial intelligence based estimator may comprise: converting scaled input vector data values into a plurality of state vector elements using a single Long Short-Term Memory layer; converting the set of sample values into a voltage variance value and a voltage mean value; forming a linear combination of the plurality of state vector elements, the voltage variance value and the voltage mean value; and multiplying each of the plurality of state vector elements, the voltage variance value and the voltage mean value by a corresponding one of a plurality of weight values and combining resulting factors into a final state of charge value used to update a corresponding one of the plurality of state of charge values.

In one or more embodiments, said periodically invoking an artificial intelligence based estimator may comprise loading one of a plurality of artificial intelligence models and a corresponding one of a plurality of coefficients for calibrating a corresponding one of the plurality of cells of the battery. In one or more embodiments, said periodically invoking an artificial intelligence based estimator may comprise balancing processing of the artificial intelligence based estimator by distributing calibration among the plurality of cells of the battery over time.

A battery management system for tracking a state of charge of a battery including multiple cells including a coulomb counter (CC) estimator and an artificial intelligence (AI) estimator. The CC estimator determines a charge difference over time for tracking changes of a state of charge of each cell and updates a corresponding state of charge value. The AI estimator converts a set of sample values of a cell into an estimated state of charge for calibrating the cell. A controller may periodically invoke the AI estimator to calibrate the state of charge of each cell and to update a corresponding state of charge value. Processing by the AI estimator may be minimized by being used only to calibrate each cell before combined error of the CC estimator reaches a predetermined threshold. AI based calibration may use Long Short-Term Memories and may further incorporate voltage mean and voltage variance over time.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A battery management system for tracking a state of charge of a battery which comprises a plurality of cells, comprising:

a coulomb counter estimator that is configured to determine a charge difference over time for tracking changes of a state of charge of each of the plurality of cells of the battery and for updating a corresponding plurality of state of charge values;

an artificial intelligence estimator that is configured to convert a set of sample values of a selected one of the plurality of cells into an estimated state of charge of the selected cell; and a controller that is configured to periodically invoke the artificial intelligence estimator to calibrate the state of charge of each of the plurality of cells and to update each of the plurality of state of charge values, wherein the battery management system is configured such that, for a first time period, a first subset of the plurality of state of charge values corresponding to a cell of the plurality of cells is updated by the artificial intelligence estimator, and, for a second time period that is longer than the first time period, a second subset of the plurality of state of charge values corresponding to the cell is updated by only the coulomb counter estimator.

2. The battery management system of claim 1, wherein the coulomb counter estimator is configured to integrate current through the plurality of cells over time and to use a plurality of cell profiles for updating the corresponding plurality of state of charge values.

3. The battery management system of claim 1, wherein the controller is configured to invoke the artificial intelligence estimator to calibrate each of the plurality of cells, one at a time, before an error of the coulomb counter estimator reaches a predetermined error threshold.

4. The battery management system of claim 1, wherein the artificial intelligence estimator comprises Long Short-Term Memories.

5. The battery management system of claim 1, wherein the artificial intelligence estimator is configured to use a plurality of coefficients that were previously determined by pretraining over a plurality of cycles.

6. The battery management system of claim 5, wherein the plurality of coefficients comprises a plurality of weight values and a plurality of bias values.

7. The battery management system of claim 1, wherein the set of sample values comprise synchronized voltage, current, and temperature samples taken over a period of time during operation of the battery.

8. The battery management system of claim 1, wherein the artificial intelligence estimator comprises:

a bidirectional Long Short-Term Memory layer that is configured to convert scaled input vector data values into a plurality of state vector elements;

a linearizer that is configured to form a linear combination of the plurality of state vector elements; and a converter that is configured to multiply each of the plurality of state vector elements by a corresponding one of a plurality of weight values and to combine resulting factors into a final state of charge value used to update a corresponding one of the plurality of state of charge values.

9. The battery management system of claim 1, wherein the artificial intelligence estimator comprises:

a single Long Short-Term Memory layer that is configured to convert scaled input vector data values into a plurality of state vector elements;

a voltage calculator that is configured to convert the set of sample values into a voltage variance value and a voltage mean value;

a linearizer that is configured to form a linear combination of the plurality of state vector elements, the voltage variance value and the voltage mean value; and a converter that is configured to multiply each of the plurality of state vector elements, the voltage variance value and the voltage mean value by a corresponding one of a plurality of weight values and to combine resulting factors into a final state of charge value used to update a corresponding one of the plurality of state of charge values.

10. The battery management system of claim 1, wherein the artificial intelligence estimator is configured to load one of a plurality of artificial intelligence models and a corresponding one of a plurality of coefficients to calibrate a corresponding one of the plurality of cells of the battery.

11. A method of tracking a state of charge of a battery which comprises a plurality of cells, comprising:

counting coulombs for determining a charge difference over time for tracking changes of a state of charge of each of the plurality of cells of the battery and updating a corresponding plurality of state of charge values; and periodically invoking an artificial intelligence based estimator for converting a set of sample values of a selected one of the plurality of cells to calibrate the selected cell and to update a corresponding one of the plurality of state of charge values, wherein said periodically invoking an artificial intelligence based estimator comprises:

converting scaled input vector data values into a plurality of state vector elements using a bidirectional Long Short-Term Memory layer;

forming a linear combination of the plurality of state vector elements; and multiplying each of the plurality of state vector elements by a corresponding one of a plurality of weight values and combining resulting factors into a final state of charge value used to update a corresponding one of the plurality of state of charge values.

12. The method of claim 11, wherein said counting coulombs comprises integrating current through the plurality of cells over time and using a plurality of cell profiles for updating the corresponding plurality of state of charge values.

13. The method of claim 11, wherein said periodically invoking an artificial intelligence based estimator comprises invoking the artificial intelligence based estimator to calibrate each of the plurality of cells, one at a time, before an error of any one of the plurality of state of charge values reaches a predetermined error threshold.

14. The method of claim 11, wherein said periodically invoking an artificial intelligence based estimator comprises using a plurality of coefficients that were previously determined by pretraining over a plurality of cycles.

15. The method of claim 14, wherein said using a plurality of coefficients comprises using a plurality of weight values and a corresponding plurality of bias values.

16. The method of claim 11, further comprising taking synchronized voltage, current, and temperature samples over a period of time during operation of the battery.

17. The method of claim 11, wherein said periodically invoking an artificial intelligence based estimator comprises loading one of a plurality of artificial intelligence models and a corresponding one of a plurality of coefficients for calibrating a corresponding one of the plurality of cells of the battery.

18. The method of claim 11, wherein said periodically invoking an artificial intelligence based estimator comprises balancing processing of the artificial intelligence based estimator by distributing calibration among the plurality of cells of the battery over time.

19. A method of tracking a state of charge of a battery which comprises a plurality of cells, comprising:

counting coulombs for determining a charge difference over time for tracking changes of a state of charge of each of the plurality of cells of the battery and updating a corresponding plurality of state of charge values; and periodically invoking an artificial intelligence based estimator for converting a set of sample values of a selected one of the plurality of cells to calibrate the selected cell and to update a corresponding one of the plurality of state of charge values, wherein said periodically invoking an artificial intelligence based estimator comprises:

converting scaled input vector data values into a plurality of state vector elements using a single Long Short-Term Memory layer;

converting the set of sample values into a voltage variance value and a voltage mean value;

forming a linear combination of the plurality of state vector elements, the voltage variance value and the voltage mean value; and multiplying each of the plurality of state vector elements, the voltage variance value and the voltage mean value by a corresponding one of a plurality of weight values and combining resulting factors into a final state of charge value used to update a corresponding one of the plurality of state of charge values.

* * * * *